(12) United States Patent
Choi et al.

(10) Patent No.: US 12,396,315 B2
(45) Date of Patent: Aug. 19, 2025

(54) FLEXIBLE TRANSPARENT ELECTRODE STRUCTURE HAVING SUPERIOR LIGHT TRANSMITTANCE, WATER PERMEATION RESISTANCE AND OXYGEN PERMEATION RESISTANCE, METHOD FOR PREPARING THE SAME, AND ORGANIC OPTOELECTRONIC DEVICE USING THE SAME

(71) Applicant: KOREA INSTITUTE OF SCIENCE AND TECHNOLOGY, Seoul (KR)

(72) Inventors: Won-Kook Choi, Seoul (KR); Keun Yong Lim, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 538 days.

(21) Appl. No.: 17/951,178

(22) Filed: Sep. 23, 2022

(65) Prior Publication Data
US 2023/0099482 A1 Mar. 30, 2023

(30) Foreign Application Priority Data

Sep. 29, 2021 (KR) ......................... 10-2021-0129105

(51) Int. Cl.
*H10K 30/82* (2023.01)
*H10K 50/816* (2023.01)

(52) U.S. Cl.
CPC ........... *H10K 30/82* (2023.02); *H10K 50/816* (2023.02)

(58) Field of Classification Search
CPC ...... H10K 30/82; H10K 30/88; H10K 50/816; H10K 50/84; H10K 77/11
See application file for complete search history.

(56) References Cited

U.S. PATENT DOCUMENTS 9,359,505 B2     6/2016   Ii et al.
2016/0111684 A1*  4/2016   Savas ................. C23C 16/50
                                                         438/26

FOREIGN PATENT DOCUMENTS

EP   3 753 994 B1   6/2021
JP   2021-6900 A    1/2021
(Continued)

OTHER PUBLICATIONS

Su, Dung-Yue, et al. "Fabrication, mechanisms, and properties of high-performance flexible transparent conductive gas-barrier films based on Ag nanowires and atomic layer deposition." *ACS applied materials & interfaces* vol. 11. Issue 37 (2019). pp. 34212-34221.

(Continued)

*Primary Examiner* — Daniel P Shook
(74) *Attorney, Agent, or Firm* — NSIP Law

(57) ABSTRACT

Disclosed are a flexible transparent electrode structure, a method for preparing the same, and an organic optoelectronic device using the same. The flexible transparent electrode structure includes: a flexible substrate; a thin film laminate of a triple-layer structure formed on both sides of the flexible substrate; and a transparent electrode formed on the thin film laminate of a triple-layer structure provided on one side of the flexible substrate, wherein the thin film laminate of a triple-layer structure includes a $SiN_x$ thin film, a $SiO_xN_y$ thin film and a $SiO_x$ thin film formed sequentially on the flexible substrate. The flexible transparent electrode structure has superior light transmittance, water permeation resistance and oxygen permeation resistance, which can improve the electrical properties of an organic optoelectronic device.

14 Claims, 17 Drawing Sheets

(56) References Cited

FOREIGN PATENT DOCUMENTS

| KR | 10-2012-0082985 A | 7/2012 |
| KR | 10-1448041 B | 10/2014 |
| KR | 10-1461346 B1 | 11/2014 |
| KR | 10-2016-0020838 A | 2/2016 |
| KR | 10-2017-0106093 A | 9/2017 |
| KR | 10-2159993 B1 | 9/2020 |
| KR | 10-2236190 B1 | 4/2021 |
| KR | 10-2343768 B1 | 12/2021 |

OTHER PUBLICATIONS

Noh, Yong-Jin, et al. "Cost-effective ITO-free organic solar cells with silver nanowire-PEDOT: PSS composite electrodes via a one-step spray deposition method." *Solar Energy Materials and Solar Cells* 120 (2014). pp. 226-230.

\* cited by examiner

[FIG. 1]
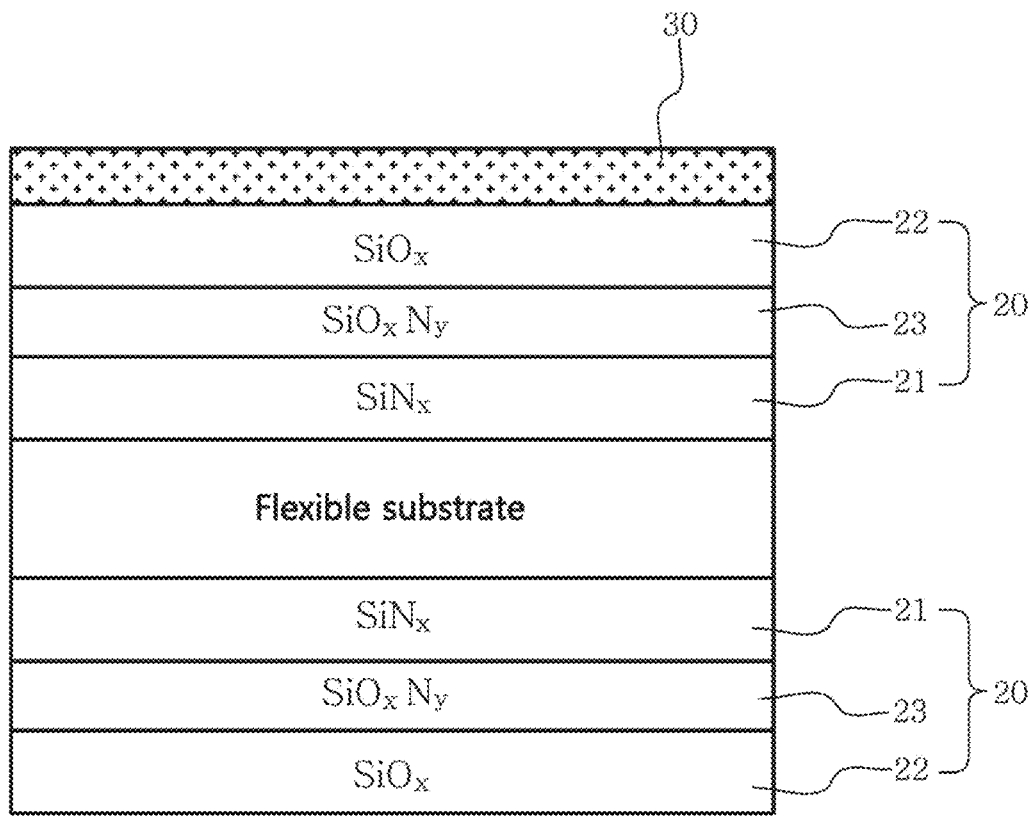

[FIG. 2]
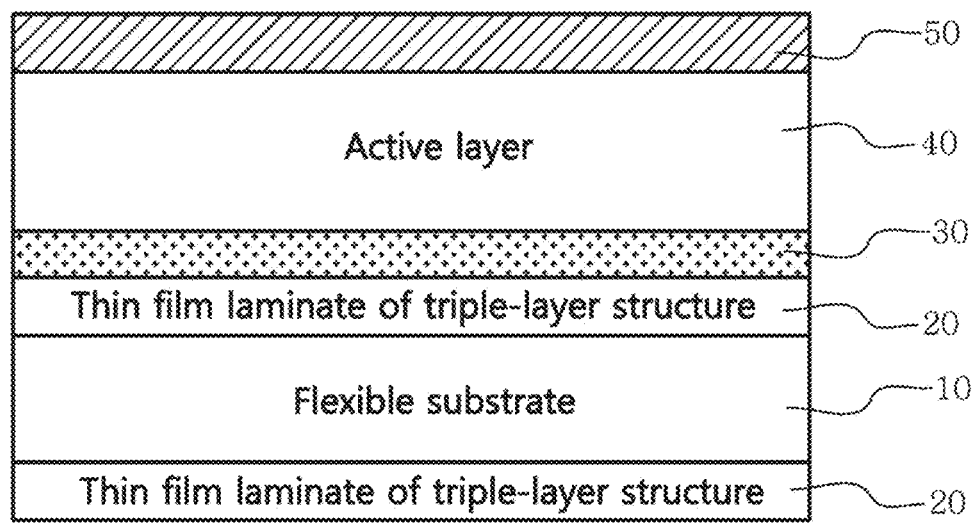

[FIG. 3]
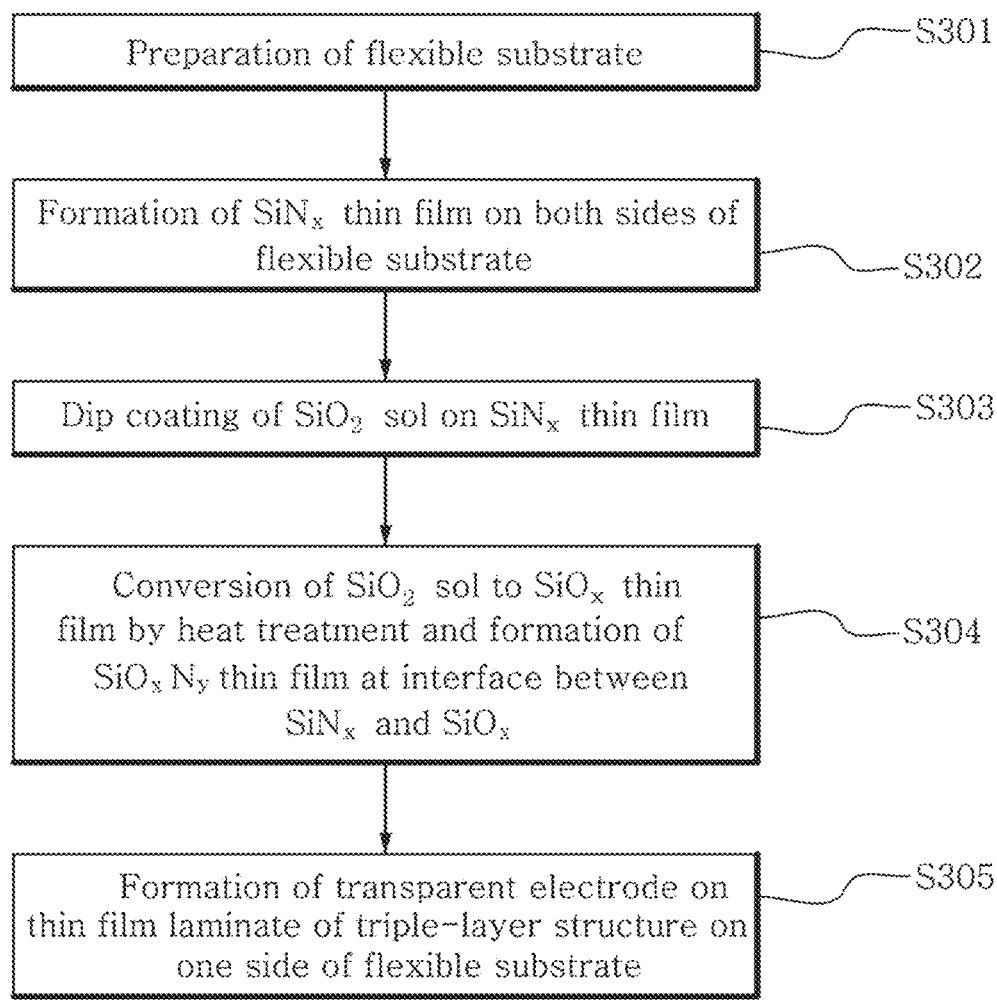

[FIG. 4A]
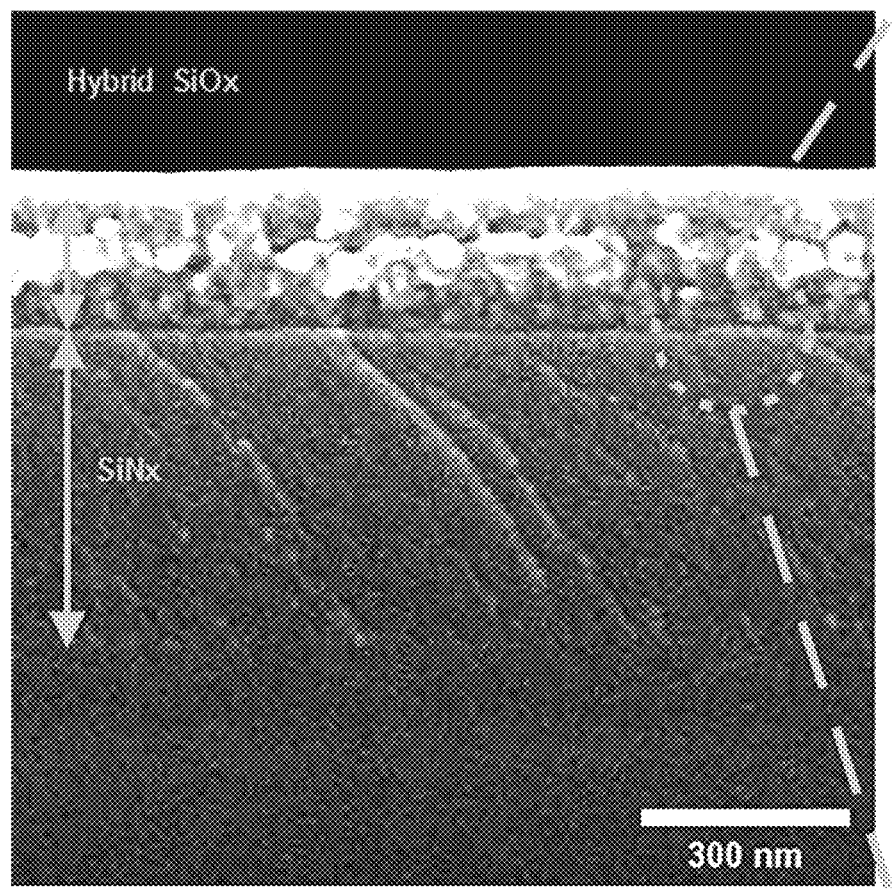

[FIG. 4B]
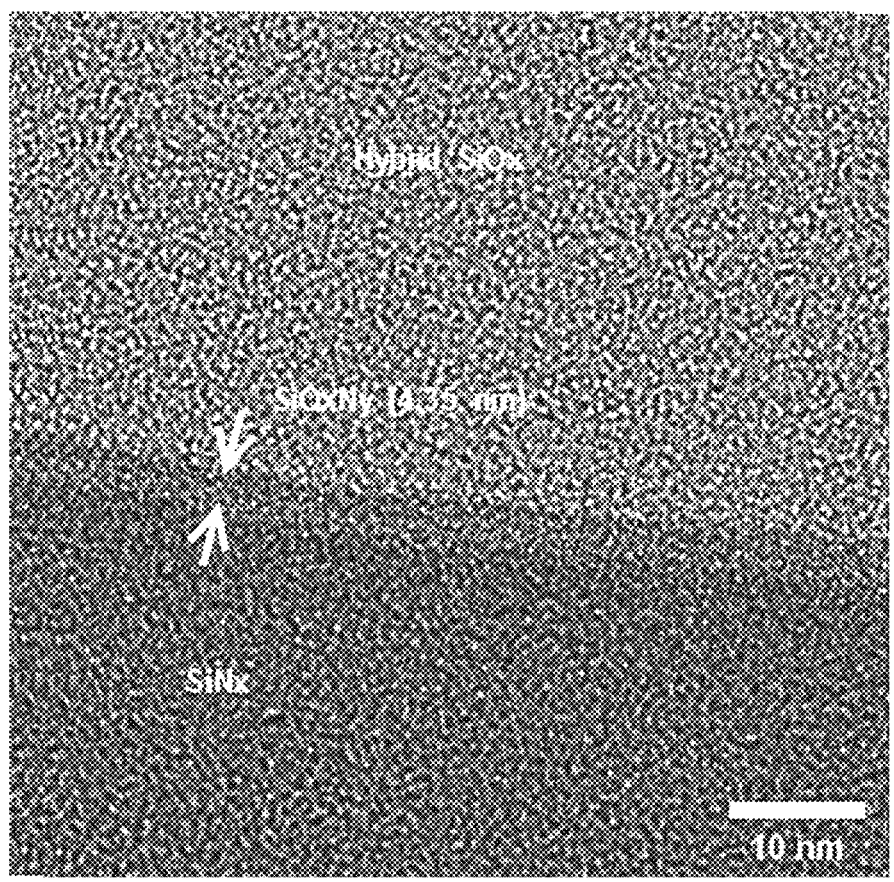

[FIG. 5A]
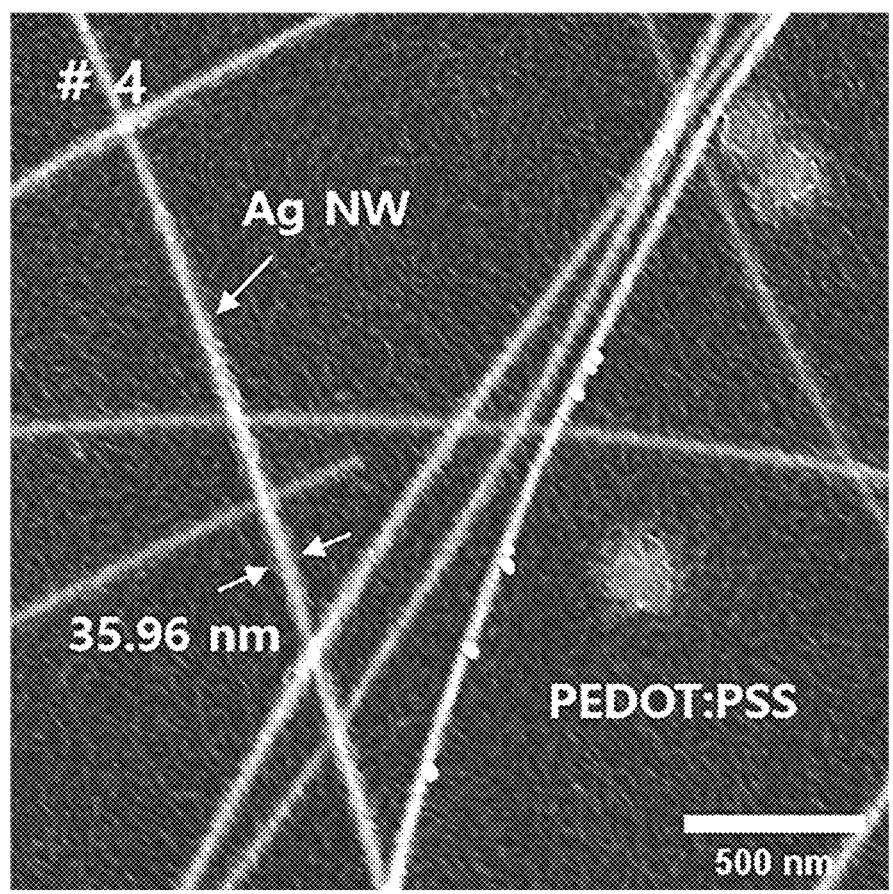

[FIG. 5B]
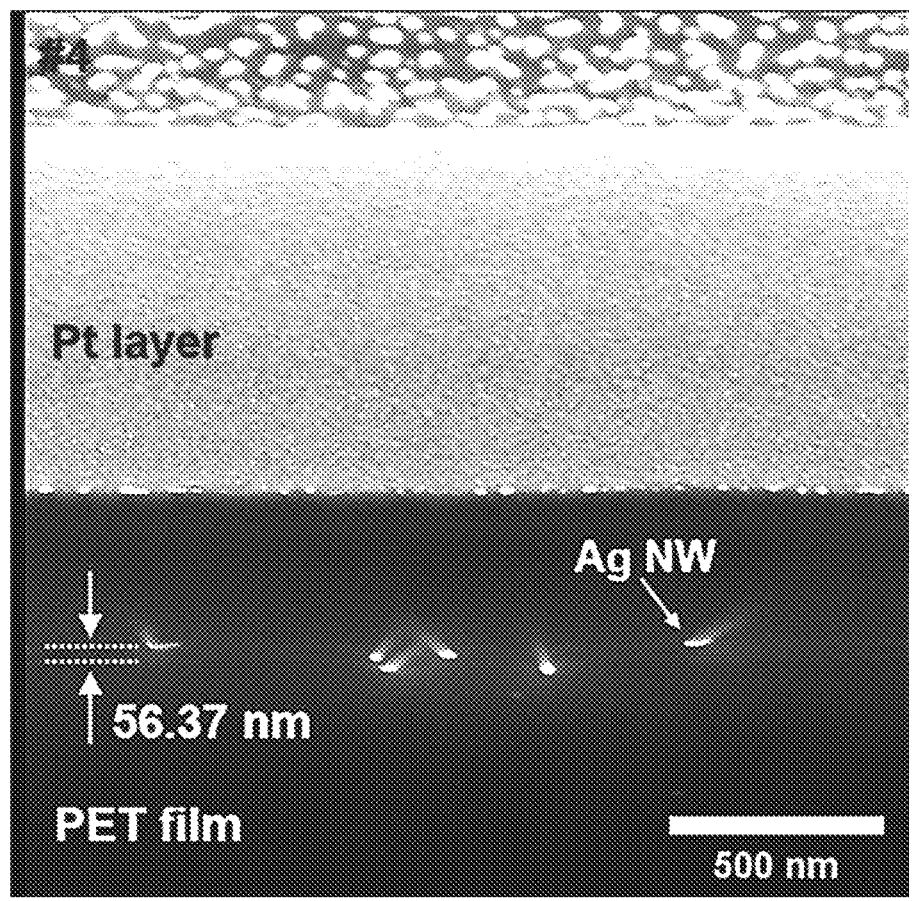

[FIG. 6A]
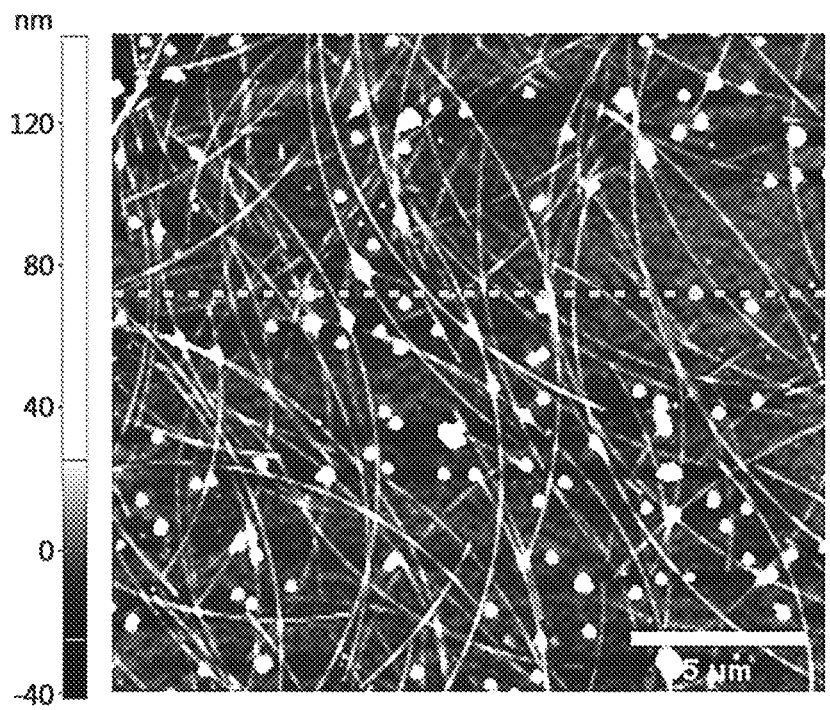
[FIG. 6B]
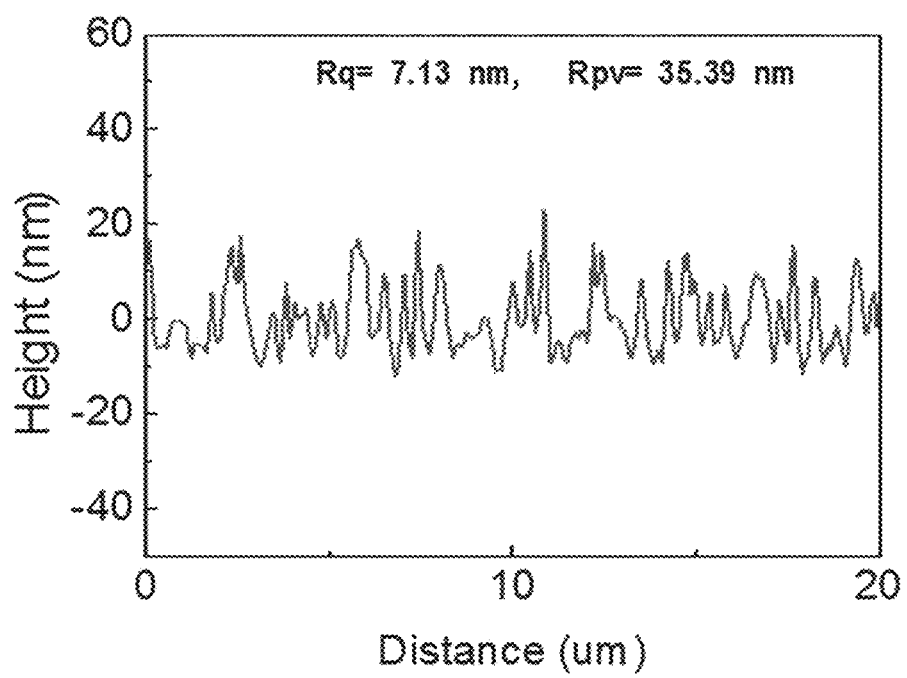

[FIG. 7A]
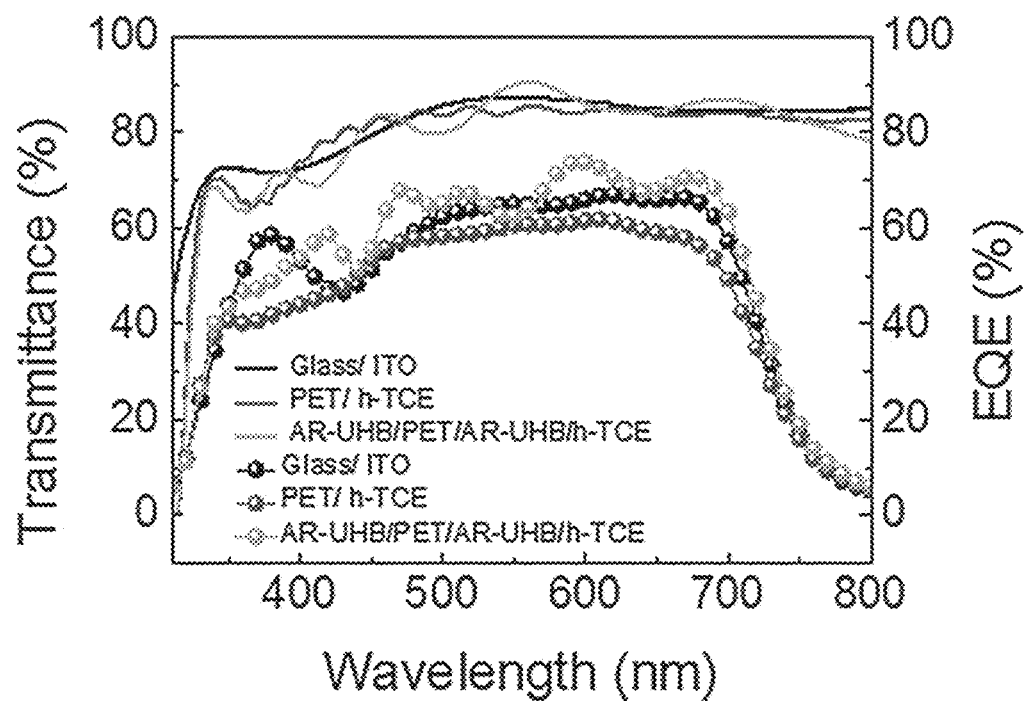

[FIG. 7B]
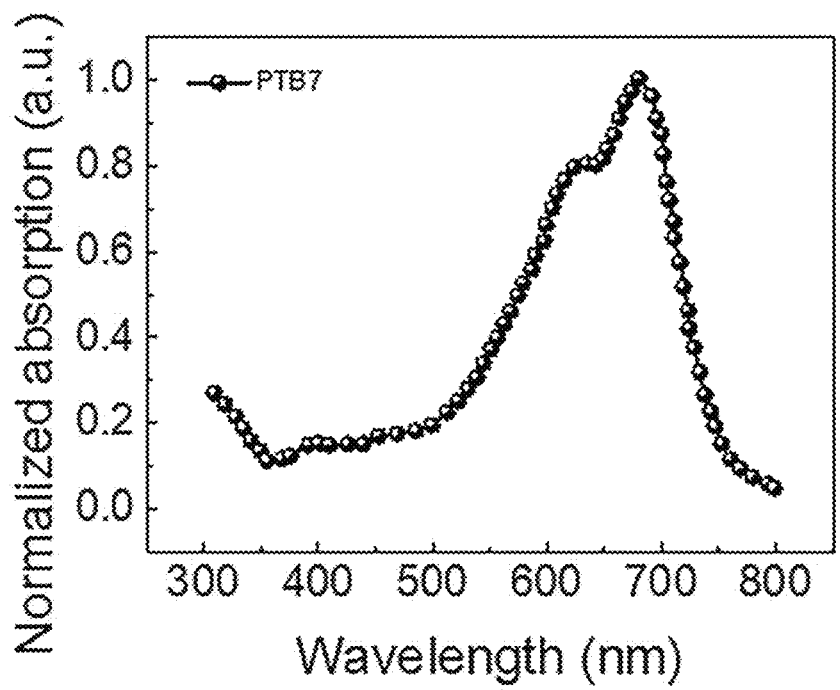
[FIG. 7C]
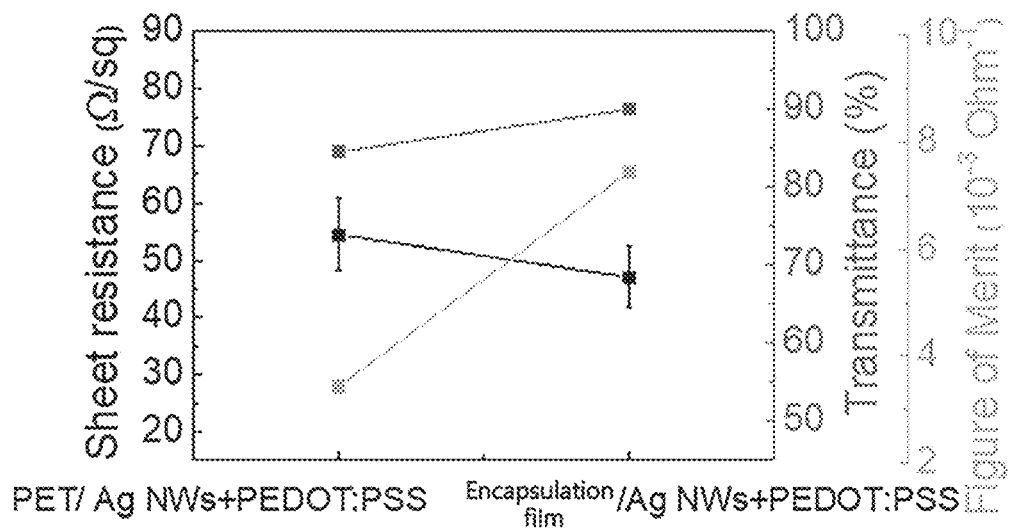

[FIG. 8A]
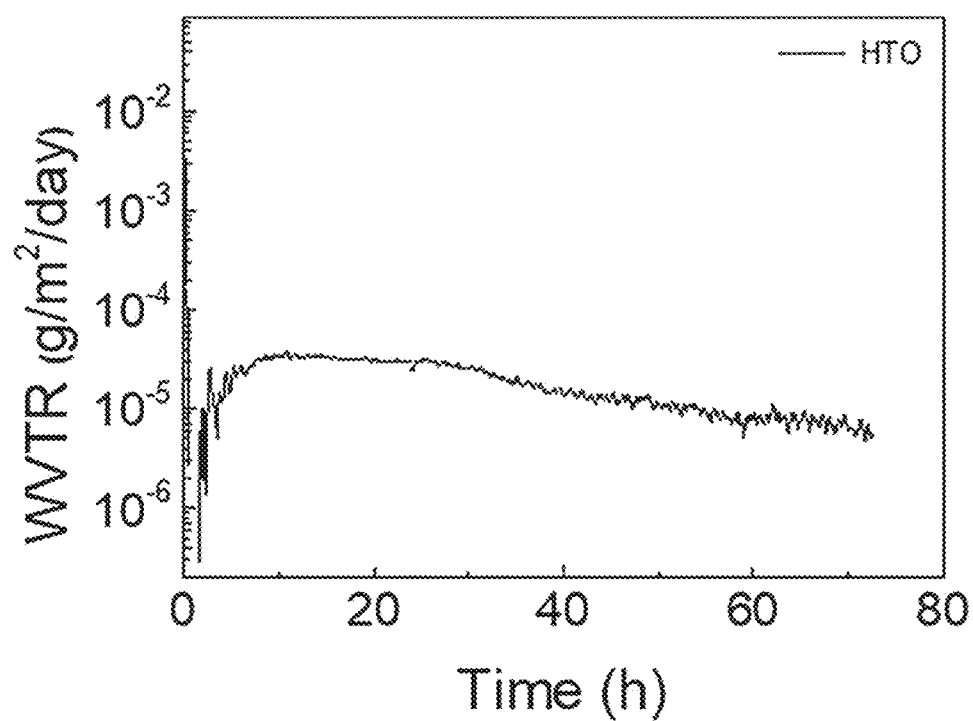

[FIG. 8B]
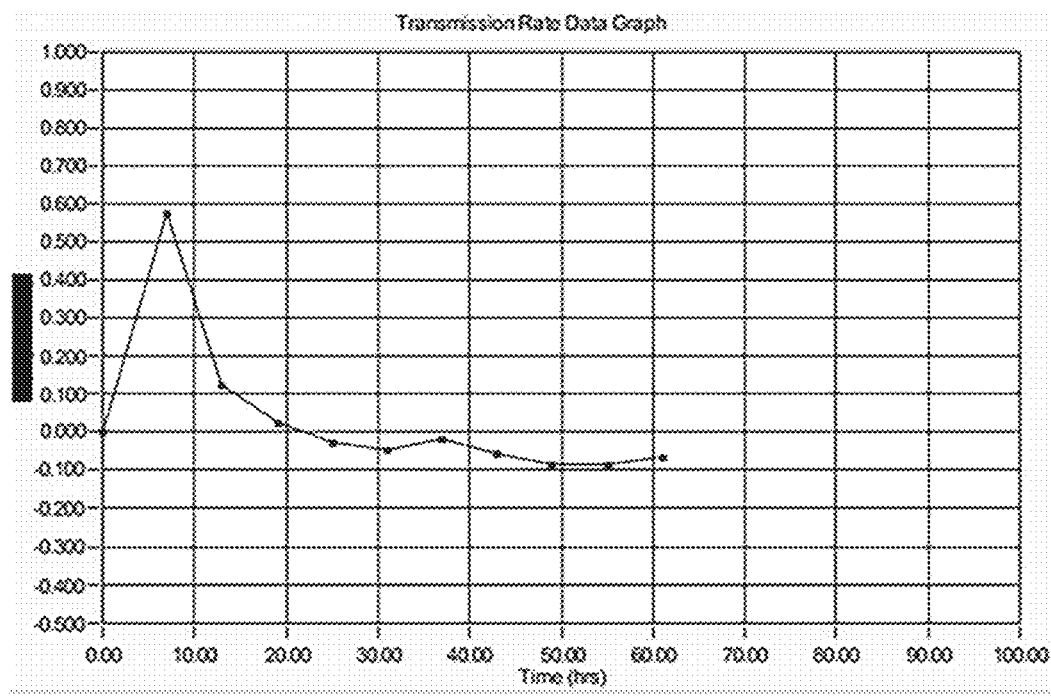
[FIG. 9A]
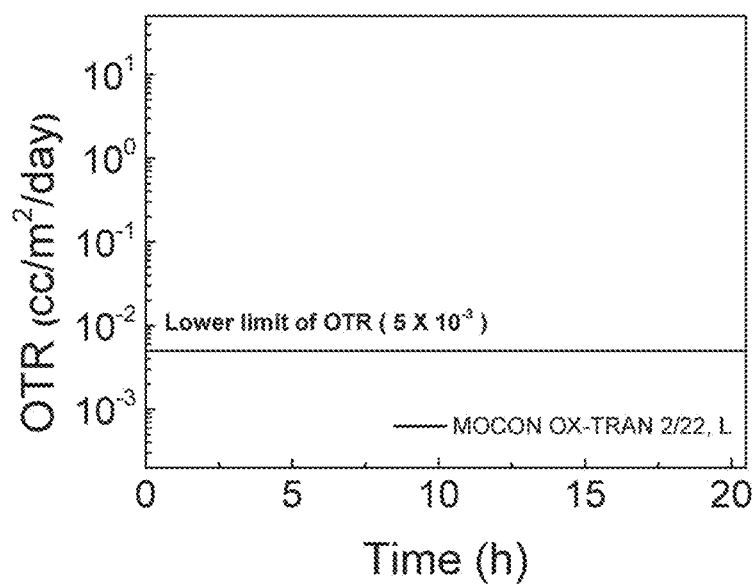

[FIG. 9B]
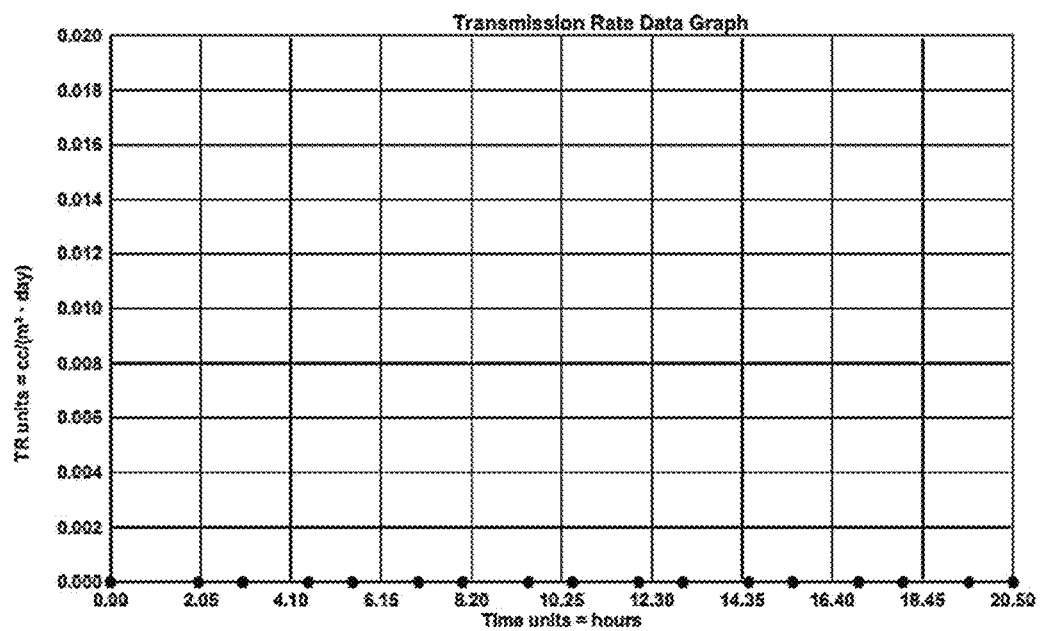
[FIG. 10A]
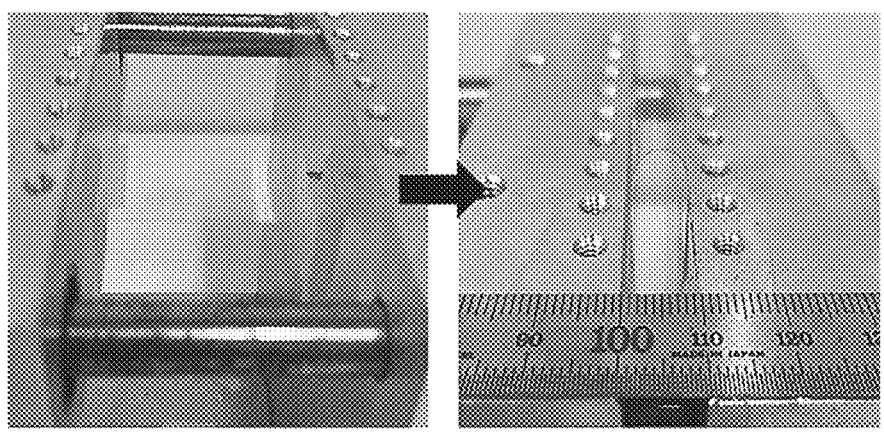

[FIG. 10B]
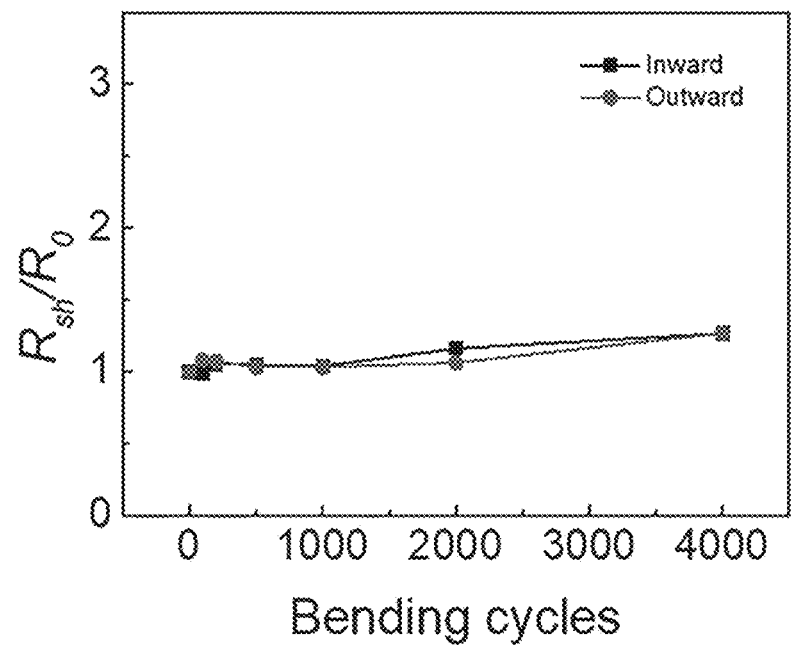
[FIG. 10C]
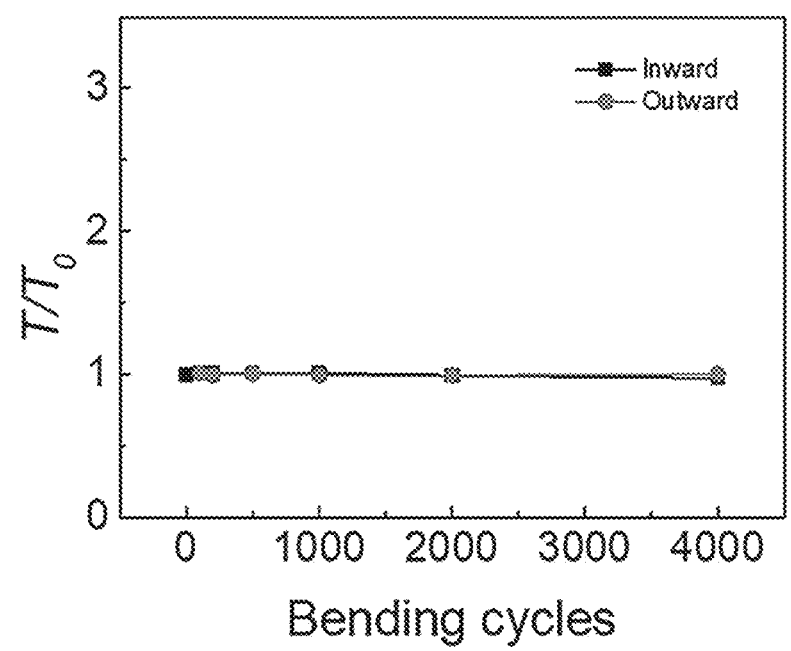

[FIG. 11]
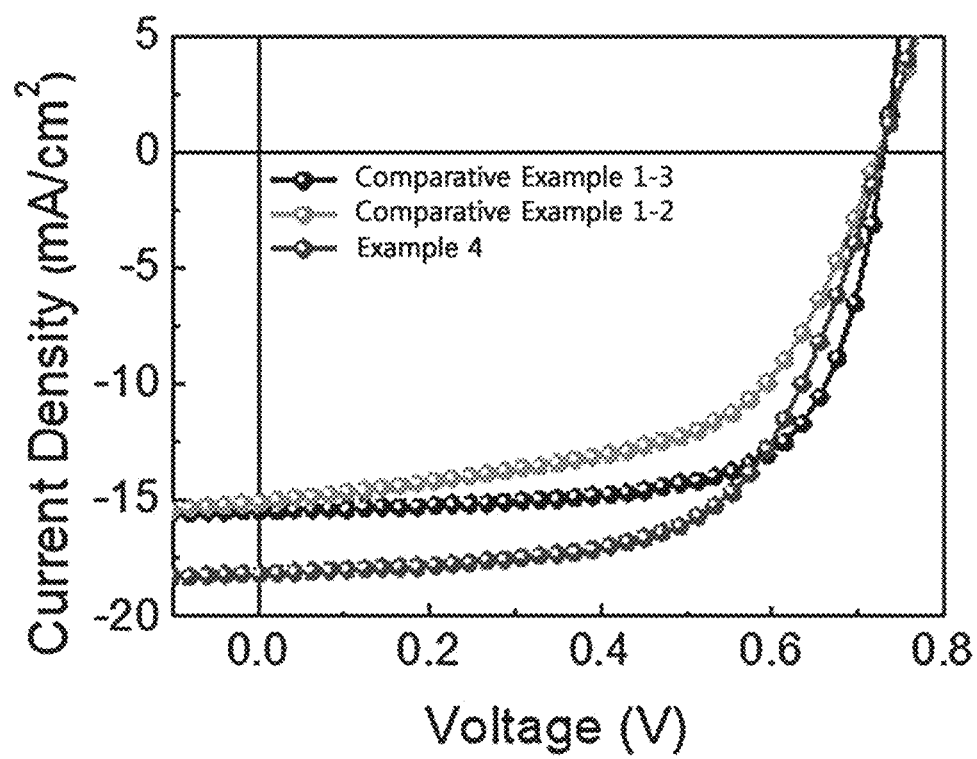

[FIG. 12A]
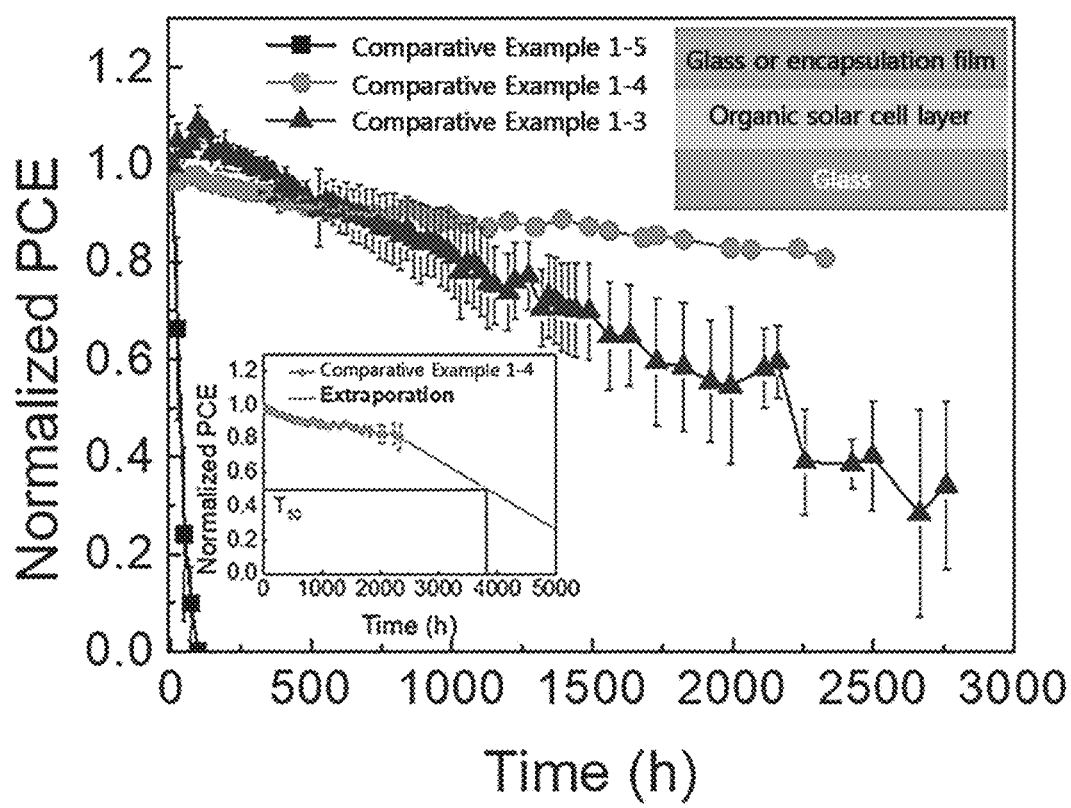

[FIG. 12B]
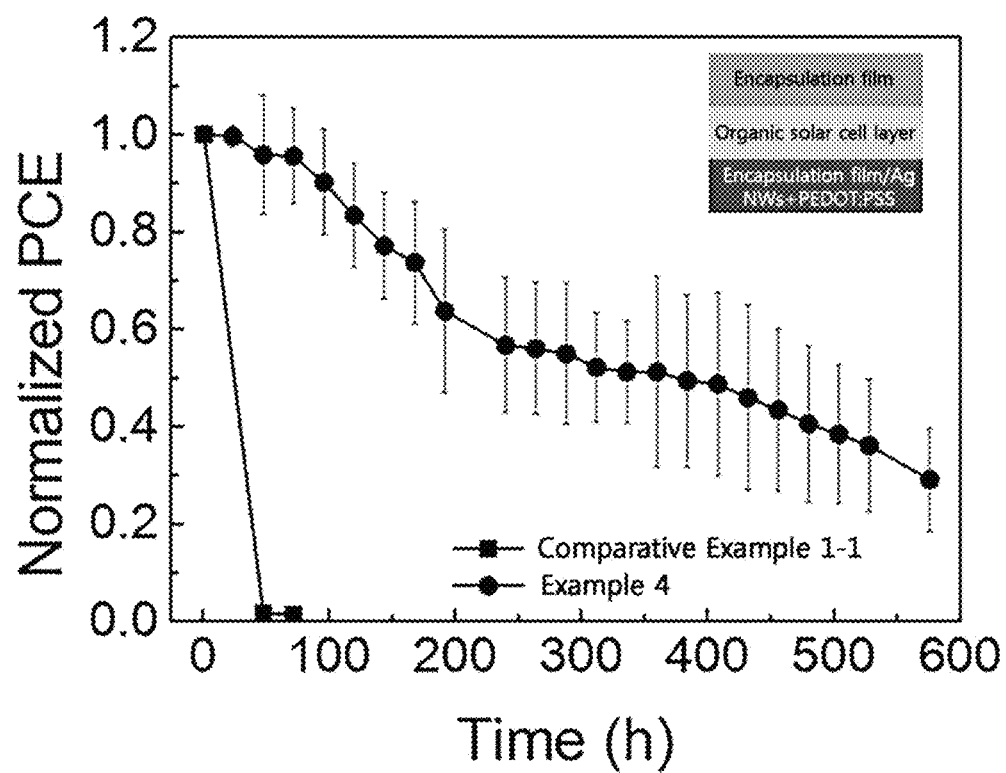

FLEXIBLE TRANSPARENT ELECTRODE STRUCTURE HAVING SUPERIOR LIGHT TRANSMITTANCE, WATER PERMEATION RESISTANCE AND OXYGEN PERMEATION RESISTANCE, METHOD FOR PREPARING THE SAME, AND ORGANIC OPTOELECTRONIC DEVICE USING THE SAME

DESCRIPTION OF GOVERNMENT-SUPPORTED RESEARCH AND DEVELOPMENT

This research was conducted by the Korea Institute of Science and Technology under supervision by the Korea Evaluation Institute of Industrial Technology of the Ministry of Trade, Industry and Energy, with the project title Development of manufacture-based core industrial technology and the research title Development of technology for evaluation and improvement of flexible OLED/OPV device performance (Project ID No: 1415129586).

TECHNICAL FIELD

Cross-Reference to Related Application

This application claims the priority of Korean Patent Publication Application No. 10-2021-0129105, filed on Sep. 29, 2021, the entire contents of which in their entirety are incorporated by reference.

In addition, this research was conducted by Sung An Machinery Co., Ltd. under supervision by the Korea Institute of Energy Technology Evaluation and Planning of the Ministry of Trade, Industry and Energy, with the project title Development of core renewable energy technology and the research title Development of process and apparatus for continuous printing-type conductive barrier composite film for next-generation solar cell (Project ID No: 1415153958).

The present disclosure relates to a flexible transparent electrode structure having superior light transmittance, water permeation resistance and oxygen permeation resistance, a method for preparing the same, and an organic optoelectronic device using the same. More specifically, it relates to a flexible transparent electrode structure having superior light transmittance, water permeation resistance and oxygen permeation resistance, which can improve the electrical properties of an organic optoelectronic device such as improved photoconversion efficiency of an organic solar cell due to high light transmittance, and can extend the lifetime of an organic optoelectronic device by preventing penetration of water and oxygen into the organic optoelectronic device due to superior water permeation resistance and oxygen permeation resistance, a method for preparing the same, and an organic optoelectronic device using the same.

BACKGROUND ART

A flexible transparent electrode wherein a conductive material is coated or deposited on a flexible substrate such as PET, PES, PI, PC, PEN, etc. is actively used in organic light-emitting diodes, organic solar cells, perovskite solar cells, photoelectrochemical cells, etc.

At present, indium tin oxide (ITO) having high conductivity and superior light transmittance is widely used as a flexible conductive material. However, ITO is limited for application as a flexible substrate because deposition is conducted at 300° C. or higher and cracking occurs due to low resistance to the bending of the substrate.

Metal nanowires, conductive polymers, CNT films, graphene, transparent conductive oxides, etc. are studied actively as materials for compensating for its disadvantages and replacing the same. In particular, metal nanowires such as silver, copper, etc. are drawing attentions as alternative materials to ITO because of high electrical conductivity and flexible property. However, silver nanowire is limited in application to organic optoelectronic device due to high surface roughness and oxidation may occur owing to water present in the air.

As such, when metal nanowires are used instead of ITO in a flexible transparent electrode using a flexible substrate, it is difficult to improve the electrical properties of the device such as photoconversion efficiency, etc.

In order to improve the electrical properties of a device using a flexible transparent electrode such as photoconversion efficiency, etc., light transmittance and water permeation resistance should be ensured. Light transmittance directly affects the electrical properties of the device such as photoconversion efficiency, etc., and water permeation resistance is required to prevent the deterioration of device components due to oxidation of metal nanowires by water, etc.

The applicant and inventors of the present disclosure have presented an encapsulation film having a very superior water vapor transmission rate of $2 \times 10^{-6}$ g/m$^2$/day or lower in Korean Patent Registration No. 2159993 (published on Sep. 25, 2020) and Korean Patent Registration No. 2236190 (published on Apr. 6, 2021). The encapsulation film can be used as an encapsulation film of an organic optoelectronic device.

DISCLOSURE

Technical Problem

The present disclosure is directed to providing a flexible transparent electrode structure having superior light transmittance, water permeation resistance and oxygen permeation resistance, which can improve the electrical properties of an organic optoelectronic device such as improved photoconversion efficiency of an organic solar cell due to high light transmittance, and can extend the lifetime of an organic optoelectronic device by preventing penetration of water and oxygen into the organic optoelectronic device due to superior water permeation resistance and oxygen permeation resistance, a method for preparing the same, and an organic optoelectronic device using the same.

Technical Solution

A flexible transparent electrode structure according to the present disclosure includes: a flexible substrate; a thin film laminate of a triple-layer structure formed on both sides of the flexible substrate; and a transparent electrode formed on the thin film laminate of a triple-layer structure provided on one side of the flexible substrate, wherein the thin film laminate of a triple-layer structure includes a $SiN_x$ thin film, a $SiO_xN_y$ thin film and a $SiO_x$ thin film formed sequentially on the flexible substrate.

The flexible transparent electrode structure has an average light transmittance of 86.56% or higher in a wavelength range of 550-720 nm. In addition, the structure with the thin film laminate of a triple-layer structure formed on both sides of the flexible substrate has a water vapor transmission rate of $5 \times 10^{-5}$ g/m$^2$/day or lower. And, the structure with the thin film laminate of a triple-layer structure formed on both sides of the flexible substrate has an oxygen transmission rate of $5 \times 10^{-3}$ cc/m$^2$/day/atm or lower.

The SiN$_x$ thin film, the SiO$_x$N$_y$ thin film and the SiO$_x$ thin film forms a refractive index gradient, and the SiN$_x$ thin film has the highest refractive index and the SiO$_x$ thin film has the lowest refractive index.

The transparent electrode is composed of a metal nanowire and a polymer conductor.

An organic optoelectronic device according to the present disclosure includes a flexible transparent electrode structure as a lower substrate, wherein the flexible transparent electrode structure includes: a flexible substrate; a thin film laminate of a triple-layer structure formed on both sides of the flexible substrate; and a transparent electrode formed on the thin film laminate of a triple-layer structure provided on one side of the flexible substrate, and the thin film laminate of a triple-layer structure includes a SiN$_x$ thin film, a SiO$_x$N$_y$ thin film and a SiO$_x$ thin film formed sequentially on the flexible substrate.

The flexible transparent electrode structure has an average light transmittance of 86.56% or higher in a wavelength range of 550-720 nm. In addition, the structure with the thin film laminate of a triple-layer structure formed on both sides of the flexible substrate has a water vapor transmission rate of $5 \times 10^{-5}$ g/m$^2$/day or lower. And, the structure with the thin film laminate of a triple-layer structure formed on both sides of the flexible substrate has an oxygen transmission rate of $5 \times 10^{-3}$ cc/m$^2$/day/atm or lower.

The SiN$_x$ thin film, the SiO$_x$N$_y$ thin film and the SiO$_x$ thin film forms a refractive index gradient, and the SiN$_x$ thin film has the highest refractive index and the SiO$_x$ thin film has the lowest refractive index.

The transparent electrode is composed of a metal nanowire and a polymer conductor.

The organic optoelectronic device is any of an organic solar cell, an organic light-emitting diode, a perovskite solar cell and a photoelectrochemical cell.

The organic optoelectronic device further includes an encapsulation film encapsulating the organic optoelectronic device, the encapsulation film has a structure in which a thin film laminate of a triple-layer structure is formed on both sides of a flexible substrate, and the thin film laminate of a triple-layer structure has a SiN$_x$ thin film, a SiO$_x$N$_y$ thin film and a SiO$_x$ thin film formed sequentially on the flexible substrate.

A method for prepare a flexible transparent electrode structure according to the present disclosure includes: a step of forming SiN$_x$ thin films on both sides of a flexible substrate; a step of dip-coating a SiO$_2$ sol on each of the SiN$_x$ thin films; a step of converting the SiO$_2$ sol to a SiO$_x$ thin film by heat-treating the flexible substrate and, at the same time, forming a SiO$_x$N$_y$ thin film at an interface of the SiN$_x$ thin film and the SiO$_x$ thin film; and a step of forming a transparent electrode on the SiO$_x$ thin film on one side of the flexible substrate.

The flexible transparent electrode structure has an average light transmittance of 86.56% or higher in a wavelength range of 550-720 nm. In addition, the structure with the thin film laminate of a triple-layer structure formed on both sides of the flexible substrate has a water vapor transmission rate of $5 \times 10^{-5}$ g/m$^2$/day or lower. And, the structure with the thin film laminate of a triple-layer structure formed on both sides of the flexible substrate has an oxygen transmission rate of $5 \times 10^{-3}$ cc/m$^2$/day/atm or lower.

The SiN$_x$ thin film, the SiO$_x$N$_y$ thin film and the SiO$_x$ thin film forms a refractive index gradient, and the SiN$_x$ thin film has the highest refractive index and the SiO$_x$ thin film has the lowest refractive index.

The transparent electrode is prepared by a process of coating a polymer conductor solution in which a metal nanowire is dispersed on a SiO$_x$ thin film and then forming a transparent electrode formed of the metal nanowire and the polymer conductor by heat-treating the same.

Advantageous Effects

A flexible transparent electrode structure having superior light transmittance, water permeation resistance and oxygen permeation resistance according to the present disclosure, a method for preparing the same and an organic optoelectronic device using the same provide the following effects.

By using the thin film laminate of a triple-layer structure having superior light transmittance, water permeation resistance and oxygen permeation resistance as a flexible transparent electrode in an organic optoelectronic device including an organic solar cell, the electrical properties of the organic optoelectronic device such as the photoconversion efficiency of the organic solar cell, etc. can be improved and the lifetime of the organic optoelectronic device can be improved.

BRIEF DESCRIPTION OF DRAWINGS

FIG. 1 shows the configuration of a flexible transparent electrode structure according to an exemplary embodiment of the present disclosure.

FIG. 2 shows the configuration of an organic optoelectronic device including a flexible transparent electrode structure according to an exemplary embodiment of the present disclosure.

FIG. 3 shows a flow diagram for illustrating a method for preparing a flexible transparent electrode structure according to an exemplary embodiment of the present disclosure.

FIG. 4A shows an SEM analysis result of a flexible substrate/thin film laminate of a triple-layer structure prepared in Example 1.

FIG. 4B shows a TEM analysis result of a flexible substrate/thin film laminate of a triple-layer structure prepared in Example 1.

FIG. 5A and FIG. 5B show a focused ion beam scanning electron microscopy (FIB-SEM) analysis result of a flexible transparent electrode structure prepared in Example 2.

FIG. 6A and FIG. 6B show an AFM analysis result of a flexible transparent electrode structure prepared in Example 2.

FIG. 7A shows a result of comparing light transmittance.

FIG. 7B shows the light absorption characteristics of PTB7.

FIG. 7C shows a result of comparing sheet resistance and FOM.

FIG. 8A and FIG. 8B show a result of measuring the water vapor transmission rate of a flexible substrate/thin film laminate of a triple-layer structure prepared in Example 1.

FIG. 9A and FIG. 9B show a result of measuring the oxygen transmission rate of a flexible substrate/thin film laminate of a triple-layer structure prepared in Example 1.

FIG. 10A shows bending test of a flexible transparent electrode structure prepared in Example 2, FIG. 10B shows the change in sheet resistance during the bending test, and FIG. 10C shows the change in light transmittance during the bending test.

FIG. 11 shows the short-circuit current density (Jsc, mA/cm$^2$) of organic solar cells of Example 3, Comparative Example 2 and Comparative Example 3 depending on voltage.

FIG. 12A shows the effect of a flexible substrate/thin film laminate of a triple-layer structure of Example 1 on the lifetime of an organic solar cell when applied to an encapsulation film.

FIG. 12B shows the lifetime characteristics of an organic solar cell depending on the presence or absence of an encapsulation film.

BEST MODE

The present disclosure provides a technology about a flexible transparent electrode structure capable of improving the electrical properties and lifetime of an organic optoelectronic device based on high light transmittance and superior water permeation resistance and oxygen permeation resistance.

The applicant and inventors of the present disclosure have presented an encapsulation film of an organic optoelectronic device having a very superior water vapor transmission rate of $2 \times 10^{-6}$ g/m$^2$/day or lower in Korean Patent Registration No. 2159993 and Korean Patent Registration No. 2236190. The encapsulation film of an organic optoelectronic device has a 'structure of a thin film laminate of a triple-layer structure formed on both sides of a flexible substrate'. The encapsulation film of an organic optoelectronic device serves to isolate the components formed on the substrate of an organic optoelectronic device, e.g., a light absorption layer, a semiconductor layer, etc. from the external environment, especially to prevent the penetration of water into the organic optoelectronic device, by encapsulating the organic optoelectronic device.

The applicant and inventors of the present disclosure have found out that a 'structure of a thin film laminate of a triple-layer structure formed on both sides of a flexible substrate' presented in Korean Patent Registration No. 2159993 and Korean Patent Registration No. 2236190 has very a superior water vapor transmission rate of $2 \times 10^{-6}$ g/m$^2$/day or lower as well as high light transmittance and superior oxygen permeation resistance. Thus, they have applied the thin film laminate of a triple-layer structure to a flexible transparent electrode of an organic optoelectronic device and identified through experiments that it has superior water permeation resistance and oxygen permeation resistance and improves the photoconversion efficiency of the organic solar cell due to high light transmittance.

As mentioned above in the 'Background Art' section, when a metal nanowire is used in a flexible transparent electrode, the performance of an organic optoelectronic device may be degraded due to high surface roughness of the metal nanowire and oxidation may occur due to water and oxygen. As a result of preparing a flexible transparent electrode by combining the 'structure of a thin film laminate of a triple-layer structure formed on both sides of a flexible substrate' disclosed in Korean Patent Registration No. 2159993 and Korean Patent Registration No. 2236190 with a silver (Ag) nanowire and testing the same, it was confirmed that the photoconversion efficiency of an organic solar cell is improved since the decrease of a fill factor due to the high surface roughness of the silver nanowire is offset sufficiently owing to significantly increased short-circuit current density caused by high light transmittance. In addition, it was confirmed that the lifetime of the organic solar cell is improved due to the superior water permeation resistance and oxygen permeation resistance of the thin film laminate of a triple-layer structure.

Although Korean Patent Registration No. 2159993 and Korean Patent Registration No. 2236190 and the present disclosure share the feature that the 'structure of a thin film laminate of a triple-layer structure formed on both sides of a flexible substrate' is used, they are different in technical field since Korean Patent Registration No. 2159993 and Korean Patent Registration No. 2236190 limit restrict the encapsulation film of the organic optoelectronic device whereas the present disclosure restricts the flexible transparent electrode of the organic optoelectronic device. It is to be noted that the present disclosure extends the technology about the 'structure of a thin film laminate of a triple-layer structure formed on both sides of a flexible substrate' to a flexible transparent electrode.

In addition, it can be said that the present disclosure is improved over Korean Patent Registration No. 2159993 and Korean Patent Registration No. 2236190 because light transmittance which affects the electrical properties of the organic optoelectronic device and oxygen permeation resistance which affects the lifetime of the organic optoelectronic device are improved.

Hereinafter, a flexible transparent electrode structure according to an exemplary embodiment of the present disclosure and an organic optoelectronic device using the same will be described in detail referring to the attached drawings.

Referring to FIG. 1, a flexible transparent electrode structure according to an exemplary embodiment of the present disclosure includes a flexible substrate 10, a thin film laminate of a triple-layer structure 20 formed on both sides of the flexible substrate 10 and a transparent electrode 30 formed on the thin film laminate of a triple-layer structure 20 provided on one side of the flexible substrate 10.

In general, an organic optoelectronic device has a structure in which components such as a photoactive layer, etc. are disposed between a lower transparent electrode and an upper electrode, and the lower transparent electrode has a structure in which ITO is formed on a glass substrate or a conductive material including a silver nanowire is formed on a flexible substrate 10 such as PET, etc.

The flexible transparent electrode structure according to an exemplary embodiment of the present disclosure is used in a lower transparent electrode of an organic optoelectronic device and replaces the glass substrate/ITO or PET/conductive material structure described above. In addition, in the present disclosure, the organic optoelectronic device refers to an optoelectronic device having flexibility, such as an organic solar cell, an organic light-emitting diode, a perovskite solar cell, a photoelectrochemical cell, etc.

The flexible substrate 10 is made of any material of PET (polyethylene terephthalate), PES (polyether sulfone), PI (polyimide), PEN (polyethylene naphthalate) and PC (polycarbonate).

The thin film laminate of a triple-layer structure 20 formed on both sides of the flexible substrate 10 is a combination of a $SiN_x$ thin film, a $SiO_xN_y$ thin film and a $SiO_x$ thin film, wherein the $SiN_x$ thin film, the $SiO_xN_y$ thin film and the $SiO_x$ thin film are formed sequentially on the flexible substrate 10.

The $SiN_x$ thin film 21, the $SiO_xN_y$ thin film 23 and the $SiO_x$ thin film 22 constituting the thin film laminate of a triple-layer structure 20 forms a refractive index gradient. The $SiN_x$ thin film 21 has the highest refractive index and the $SiO_x$ thin film 22 has the lowest refractive index. According to experiments, the refractive indices are in the order of 1.77

(SiN$_x$ thin film)>1.66 (SiO$_x$N$_y$ thin film)>1.48 (SiO$_x$ thin film). Since the SiN$_x$ thin film 21, the SiO$_x$N$_y$ thin film 23 and the SiO$_x$ thin film 22 constituting the thin film laminate of a triple-layer structure 20 forms a refractive index gradient, the reflection of the incident light is minimized and the thin film laminate of a triple-layer structure 20 exhibits high light transmittance of about 90% at a wavelength of 550 nm.

In addition, the thin film laminate of a triple-layer structure 20 has superior water permeation resistance and oxygen permeation resistance in addition to the high light transmittance owing to the combination of the SiN$_x$ thin film 21, the SiO$_x$N$_y$ thin film 23 and the SiO$_x$ thin film 22 forming the refractive index gradient.

In the structure wherein the SiN$_x$ thin film 21, the SiO$_x$N$_y$ thin film 23 and the SiO$_x$ thin film 22 are formed sequentially, the SiO$_x$N$_y$ thin film 23 formed between the SiN$_x$ thin film 21 and the SiO$_x$ thin film 22 due to dehydration of the SiN$_x$ thin film plays an important role in preventing water and oxygen permeation due to a dense structure. The dense structure of the SiO$_x$N$_y$ thin film 23 is determined by the optimal coating thickness during dip coating of a SiO$_2$ sol and the optimal heat treatment condition during heat treatment for formation of the SiO$_x$N$_y$ thin film 23. In addition, according to experimental results that will be described later, thin film laminate of a triple-layer structure 20 has a water vapor transmission rate (WVTR) of 5×10$^{-5}$ g/m$^2$/day or lower and an oxygen transmission rate (OTR) of 5×10$^{-3}$ cc/m$^2$/day/atm or lower. The water vapor transmission rate and the oxygen transmission rate satisfy the water permeation resistance and the oxygen permeation resistance required for a lower substrate of an organic optoelectronic device and also satisfy the ultralow water vapor transmission rate of 10$^{-5}$ g/m$^2$/day to 10$^{-6}$ g/m$^2$/day and the ultralow oxygen transmission rate of 10$^{-3}$ cc/m$^2$/day/atm to 10$^{-5}$ cc/m$^2$/day/atm required for an encapsulation film.

The applicant of the present disclosure presented in Korean Patent Registration No. 2159993 and Korean Patent Registration No. 2236190 a structure in which the thin film laminate of a triple-layer structure 20 is formed on both sides of the flexible substrate 10 twice repeatedly. It is to satisfy the high water permeation resistance requirement required for the encapsulation film. For the lower substrate of an organic optoelectronic device or an organic solar cell which requires relatively low water permeation resistance, the water permeation resistance required for the lower substrate of the organic optoelectronic device may be satisfied by forming the thin film laminate of a triple-layer structure 20 on both sides of the flexible substrate 10 only once. If necessary, the thin film laminate of a triple-layer structure 20 may also be formed twice repeatedly for the flexible transparent electrode structure.

To ensure light transmittance, water permeation resistance and oxygen permeation resistance, the SiN$_x$ thin film 21 may have a thickness of about 400 nm, the SiO$_x$N$_y$ thin film 23 may have a thickness of 3-8 nm, and the SiO$_x$ thin film 22 may have a thickness of 130-170 nm.

In the present disclosure, the thin film laminate of a triple-layer structure 20 is formed on both sides of the flexible substrate 10, and a transparent electrode is formed on the thin film laminate of a triple-layer structure 20 provided on one side of the flexible substrate 10. A flexible transparent electrode structure is completed thereby.

The transparent electrode is composed of a metal nanowire and a polymer conductor. The transparent electrode composed of a metal nanowire and a polymer conductor may be completed by coating a polymer conductor solution in which a metal nanowire is dispersed on the thin film laminate of a triple-layer structure 20 formed on one side of the flexible substrate 10 and then heat-treating the same. A silver nanowire, a copper nanowire, a gold nanowire, etc. may be used as the metal nanowire, and PEDOT:PSS may be used as the polymer conductor. Other known metal nanowires and polymer conductors may also be used.

The flexible transparent electrode structure according to an exemplary embodiment of the present disclosure has been described above. As described above, the flexible transparent electrode structure according to an exemplary embodiment of the present disclosure is used in a lower substrate of an organic optoelectronic device. Examples of the organic optoelectronic device wherein the flexible transparent electrode structure of the present disclosure is used as a lower substrate may include an organic solar cell, an organic light-emitting diode, a perovskite solar cell, a photoelectrochemical cell, etc.

In addition, the organic optoelectronic device wherein the flexible transparent electrode structure according to an exemplary embodiment of the present disclosure is used as a lower substrate may have a 'structure in which the thin film laminate of a triple-layer structure 20 is formed on both sides of the flexible substrate 10' as an encapsulation film. In this case, the thin film laminate of a triple-layer structure 20 may also be formed on both sides of the flexible substrate 10 twice repeatedly.

When applied to an organic solar cell, an electron transport layer, a photoactive layer, a hole transport layer and an upper electrode may be formed sequentially on the flexible transparent electrode structure according to an exemplary embodiment of the present disclosure, which corresponds to a lower substrate, and an encapsulation film for encapsulating the electron transport layer, the photoactive layer, the hole transport layer and the upper electrode may be used.

In addition to the organic solar cell, the flexible transparent electrode structure according to an exemplary embodiment of the present disclosure may also be used in an organic light-emitting diode, a perovskite solar cell or a photoelectrochemical cell as a lower substrate. An active layer 40 and an upper electrode 50 may be formed sequentially on the flexible transparent electrode structure of each organic optoelectronic device, and an encapsulation film encapsulating the active layer and the upper electrode may be used selectively (see FIG. 2).

The flexible transparent electrode structure according to an exemplary embodiment of the present disclosure and an organic optoelectronic device using the same have been described above. Next, a method for preparing a flexible transparent electrode structure according to an exemplary embodiment of the present disclosure will be described.

First, a flexible substrate 10 is prepared as shown in FIG. 3 (S301). The flexible substrate 10 may be formed of a polymer substrate having flexibility. In an exemplary embodiment, the polymer substrate may consist of any polymer material of PET (polyethylene terephthalate), PES (polyether sulfone), PI (polyimide), PEN (polyethylene naphthalate) and PC (polycarbonate).

After the flexible substrate 10 is prepared, a SiN$_x$ thin film is formed on both sides of the flexible substrate 10 (S302). In an exemplary embodiment, the SiN$_x$ thin film 21 may be formed by PECVD (plasma-enhanced chemical vapor deposition). The formation of the SiN$_x$ thin film by PECVD may be performed using SiH$_4$, ammonia (NH$_3$) and nitrogen (N$_2$) as precursors. The film may be formed to a thickness of 400 nm at 110-130° C.

After the SiN$_x$ thin film 21 is formed on both sides of the flexible substrate 10, a SiO$_2$ sol (silica sol) is dip-coated on the $SiN_x$ thin film to a thickness of 140-180 nm under nitrogen atmosphere (S303). The coating thickness of the $SiO_2$ sol, 140-180 nm, may be achieved by controlling withdrawal speed at 3-4 mm/s during the dip coating.

Heat treatment is conducted after the $SiN_x$ thin film 21 and the $SiO_2$ sol are formed sequentially on both sides of the flexible substrate 10. Through the heat treatment, the $SiO_2$ sol is converted to a $SiO_x$ thin film 22, and a $SiO_xN_y$ thin film 23 is formed at the interface between $SiN_x$ and $SiO_x$ due to dehydration of $SiN_x$ (S304). The $SiO_xN_y$ thin film 23 is formed to a thickness of 3-8 nm. The heat treatment is performed at 110-130° C. for 8-12 hours. If the heat treatment temperature is below 110-130° C., the formed $SiO_xN_y$ thin film does not have a dense structure. Also, if the heat treatment time is shorter than 8-12 hours, a $SiO_xN_y$ thin film with a dense structure is not formed.

Through this process, a thin film laminate of a triple-layer structure 20 in which the $SiN_x$ thin film 21, the $SiO_xN_y$ thin film 23 and the $SiO_x$ thin film 22 have been formed sequentially on both sides of the flexible substrate 10 is completed.

After the thin film laminate of a triple-layer structure 20 has been formed on both sides of the flexible substrate 10, a transparent electrode is formed on the thin film laminate of a triple-layer structure 20 on one side of the flexible substrate 10 (S305). Specifically, the transparent electrode is formed by coating a polymer conductor solution in which a metal nanowire is dispersed on the thin film laminate of a triple-layer structure 20 on one side of the flexible substrate 10 and then heat-treating the same. In an exemplary embodiment, a transparent electrode 30 consisting of a silver nanowire and a polymer conductor may be formed by mayer rod coating a PEDOT:PSS solution in which a silver (Ag) nanowire is dispersed and then conducting heat treatment at 110-130° C. for 3-10 minutes.

Through the above-described processes, a flexible transparent electrode structure consisting of the flexible substrate 10, the thin film laminate of a triple-layer structure 20 formed on both sides of the flexible substrate 10, and the transparent electrode 30 formed on the thin film laminate of a triple-layer structure 20 on one side of the flexible substrate 10 may be completed.

The flexible transparent electrode structure according to an exemplary embodiment of the present disclosure, the organic optoelectronic device using the same, and the method for preparing the flexible transparent electrode structure have been described above. Hereinafter, the present disclosure will be described in more detail through examples.

Example 1: Preparation of Flexible Substrate/Thin Film Laminate of Triple-Layer Structure After injecting $SiH_4$ gas, $NH_3$ gas and $N_2$ gas at 25, 100 and 380 sccm, respectively, a $SiN_x$ thin film with a thickness of about 400 nm was formed on both sides of a PET substrate by chemical vapor deposition for 8 minutes with an RF power of 400 W at a pressure of 430 mTorr.

Then, after dip-coating a $SiO_2$ sol on the $SiN_x$ thin film on both sides of the PET substrate under nitrogen atmosphere, heat treatment was conducted in an oven at 120° C. for 10 hours or longer. Through this, a $SiO_xN_y$ thin film with a thickness of about 4 nm and a $SiO_x$ thin film with a thickness of about 150 nm were formed.

From the SEM analysis result of FIG. 4A and the TEM analysis result of FIG. 4B, it was confirmed that a thin film laminate of a triple-layer structure consisting of a $SiN_x$ thin film with a thickness of about 400 nm, a $SiO_xN_y$ thin film with a thickness of about 4-5 nm and a $SiO_x$ thin film with a thickness of about 150 nm was formed.

Example 2: Preparation of Flexible Transparent Electrode Structure

A PEDOT:PSS solution in which a silver nanowire is dispersed was mayer rod coated on the thin film laminate of a triple-layer structure on one side of the flexible substrate prepared in Example 1 at a speed of 25 mm/s and then heat-treated at 120° C. for 5 minutes. Through this, a transparent electrode with a diameter of about 36 nm and a thickness of about 56 nm was formed.

It was confirmed from the focused ion beam scanning electron microscopy (FIB-SEM) analysis result of FIG. 5A that PEDOT:PSS is filled in the space between the silver nanowires. In addition, it was confirmed from the focused ion beam scanning electron microscopy (FIB-SEM) analysis result of FIG. 5B that the PEDOT:PSS has a thickness of about 56 nm. In addition, it was confirmed from the AFM analysis result of FIG. 6A and FIG. 6B that the transparent electrode consisting of the silver nanowire and the PEDOT:PSS has a surface roughness of $R_q$=7.13 nm and $R_{pv}$=35.39 nm.

Example 3: Preparation of Organic Solar Cell

An organic solar cell was completed by using the flexible substrate/thin film laminate of a triple-layer structure prepared in Example 1 as an encapsulation film of the organic solar cell and using the flexible transparent electrode structure prepared in Example 2 as a lower substrate of the organic solar cell.

The organic solar cell has a structure of flexible transparent electrode structure/ZnO sol-gel/PTB7:PCBM/$MoO_3$/Ag. The ZnO sol-gel corresponds to an electron transport layer (ETL), the PTB7:PCBM corresponds to a photoactive layer, the $MoO_3$ corresponds to a hole transport layer (HTL), and the Ag corresponds to an upper electrode. The photoactive layer and the electron transport layer were formed by spin coating, and the hole transport layer and the upper electrode were formed by vacuum deposition.

Organic Solar Cells of Comparative Examples 1-5

Organic solar cells according to Comparative Examples 1-5 were prepared for comparison with the organic solar cell prepared in Example 3.

The organic solar cell of Comparative Example 1 is the organic solar cell of Example 3 without the encapsulation film of Example 1, the organic solar cell of Comparative Example 2 is an organic solar cell with PET/Ag nanowire-PEDOT:PSS as a lower substrate using the encapsulation film of Example 1, the organic solar cell of Comparative Example 3 is an organic solar cell with glass substrate/ITO as a lower substrate using the encapsulation film of Example 1, the organic solar cell of Comparative Example 4 is the organic solar cell of Example 3 using glass instead of the encapsulation film of Example 1, and the organic solar cell of Comparative Example 5 is the organic solar cell of Comparative Example 3 without the encapsulation film of Example 1.

Example 4: Comparison of Light Transmittance and External Quantum Efficiency

The light transmittance and external quantum efficiency (EQE) of the organic solar cell using the electrode according to Example 3, the organic solar cell using the electrode according to Comparative Example 2 and the organic solar cell using the electrode according to Comparative Example 3 were compared (see FIG. 7A and Table 1). In addition, the light absorption characteristics of PTB7 which was used as the active layer of each organic solar cell was investigated in a wavelength range of 550-720 nm (see FIG. 7B).

Referring to FIG. 7A and Table 1, it can be seen that, when Example 3 wherein PET/Ag nanowire-PEDOT:PSS and the thin film laminate of a triple-layer structure were used was compared with Comparative Example 2 wherein PET/Ag nanowire-PEDOT:PSS was used but the thin film laminate of a triple-layer structure was not used, the organic solar cell according to Example 3 exhibits remarkably superior light transmittance in all wavelength ranges. Specifically, whereas Example 3 exhibited a light transmittance of 86.56% at 550-720 nm, which is the light absorption wavelength range of PTB7, Comparative Example 2 exhibited a light transmittance of 84.33%. At a wavelength of 550 nm, Example 3 exhibited a light transmittance of 90.05% whereas Comparative Example 2 exhibited a light transmittance of 84.59%. It is though that this result is because of the improved transparency owing to decreased reflectivity caused by the refractive index gradient of $SiN_x$, $SiO_xN_y$ and $SiO_x$.

In addition, when Example 3 was compared with Comparative Example 3 wherein glass substrate/ITO was used, Example 3 exhibited a light transmittance of 90.05% at 550 nm and 86.56% at 550-720 nm, whereas Comparative Example 3 exhibited light transmittance of 87.39% and 85.62%, respectively. Accordingly, it was confirmed that the organic solar cell according to Example 3 has superior light transmittance characteristics.

Meanwhile, the organic solar cell according to Example 3 exhibited an external quantum efficiency (EQE) close to 70% at 550-720 nm, whereas the external quantum efficiency (EQE) of the organic solar cells according to Comparative Example 2 and Comparative Example 3 was around 60%.

TABLE 1

| | $T_{@ 550\ nm}$ (%) | $T_{ave\ (400\text{-}700\ nm)}$ (%) | $T_{ave\ (550\text{-}720\ nm)}$ (%) |
|---|---|---|---|
| Example 3 (AR-UHB/PET/AR-UHB/h-TCE) | 90.05 | 83.35 | 86.56 |
| Comparative Example 2 (PET/h-TCE) | 84.59 | 83.24 | 84.33 |
| Comparative Example 3 (Glass/ITO) | 87.39 | 83.79 | 85.62 |

Example 5: Comparison of Sheet Resistance and FOM

The FOM (figure of merit) of the flexible transparent electrode structure of Example 2 (PET/$SiN_x$/$SiO_xN_y$/$SiO_x$/Ag NWs-PEDOT:PSS) was calculated by measuring sheet resistance and light transmittance and it was compared with that of PET/Ag NWs-PEDOT:PSS.

Referring to FIG. 7C, it was confirmed that the flexible transparent electrode structure of Example 2 has superior sheet resistance and light transmittance characteristics as compared to PET/Ag NWs-PEDOT:PSS and also exhibits improved FOM.

Example 6: Water Vapor Transmission Rate

The water vapor transmission rate of the flexible substrate/thin film laminate of a triple-layer structure prepared in Example 1 was measured.

HTO water vapor transmission rate was measured using water containing the radioactive isotope tritium (HTO), and water vapor transmission rate was measured using MOCON's Aquatran 2. As seen from FIG. 8A, the HTO water vapor transmission rate was measured as $1.6 \times 10^{-5}$ g/m²/day. Also, as seen from FIG. 8B, the water vapor transmission rate measured using MOCON's Aquatran 2 was $5 \times 10^{-5}$ g/m²/day. Both results satisfied the ultralow water vapor transmission rate of $10^{-5}$ to $10^{-6}$ g/m²/day.

Example 7: Oxygen Transmission Rate

The oxygen transmission rate of the flexible substrate/thin film laminate of a triple-layer structure prepared in Example 1 was measured.

The oxygen transmission rate was measured using MOCON's OX-TRAN. As shown in FIG. 9A and FIG. 9B, the oxygen transmission rate was measured as $5 \times 10^{-3}$ cc/m²/day/atm regardless of time. This result suggests that the flexible substrate/thin film laminate of a triple-layer structure prepared in Example 1 actually has a water vapor transmission rate lower than $5 \times 10^{-3}$ cc/m²/day/atm.

Example 8: Sheet Resistance and Light Transmittance Characteristics after Bending Test After bending the flexible transparent electrode structure prepared in Example 2 inwardly and outwardly 4,000 times with a curvature of 5 mm, sheet resistance and light transmittance were measured. FIG. 10A shows the images of the bending test, FIG. 10B shows the change in sheet resistance during the bending test, and FIG. 10C shows the change in light transmittance during the bending test.

Referring to FIG. 10B and FIG. 10C, it can be seen that there is little change in sheet resistance and light transmittance during the 4,000 times of bending.

Example 9: Comparison of Photoconversion Efficiency

The electrical properties and photoconversion efficiency of the organic solar cell prepared in Example 3 were compared with those of the organic solar cells prepared according to Comparative Example 2 and Comparative Example 3.

As described above, the organic solar cell of Example 3 is an organic solar cell wherein the flexible substrate/thin film laminate of a triple-layer structure prepared in Example 1 is used as an encapsulation film and the flexible transparent electrode structure prepared in Example 2 is a lower substrate, the organic solar cell of Comparative Example 1 is the organic solar cell of Example 3 without the encapsulation film of Example 1, the organic solar cell of Comparative Example 2 is an organic solar cell wherein PET/Ag nanowire-PEDOT:PSS is used as a lower substrate and the encapsulation film of Example 1 is used, and the organic solar cell of Comparative Example 3 is an organic solar cell wherein glass substrate/ITO is used as a lower substrate and the encapsulation film of Example 1 is used.

FIG. 11 shows the short-circuit current density (Jsc, mA/cm²) of the organic solar cells according to Example 3, Comparative Example 2 and Comparative Example 3, and Table 2 summarizes the open-circuit voltage (Voc), short-circuit current density (Jsc), fill factor (FF) and photoconversion efficiency (η) of the organic solar cells according to Example 3, Comparative Example 2 and Comparative the Example 3. The experimental data of FIG. 11 and Table 2 were obtained under standard condition (100 mW/cm$^2$) using a solar simulator.

Referring to FIG. 11 and Table 2, it can be seen that the organic solar cell according to Example 3 exhibits improved photoconversion efficiency (7.72±0.25, 8.33%) as compared to Comparative Example 2 (5.94±0.56, 6.25%) and Comparative Example 3 (7.63±0.1, 7.87%) although the fill factor is not superior. This improvement of photoconversion efficiency is derived from the remarkably superior short-circuit current density. That is to say, whereas Example 3 exhibits a short-circuit current density of 17.67±0.54, Comparative Example 2 exhibits a short-circuit current density of 14.48±0.92 and Comparative Example 3 exhibits a short-circuit current density of 15.25±0.13.

TABLE 2

| | Open-circuit voltage ($V_{oc}$) (V) | Short-circuit current density ($J_{sc}$) (mA/cm$^2$) | Fill factor (FF) (%) | Energy conversion efficiency (η) (%) |
| --- | --- | --- | --- | --- |
| Example 3 | 0.72 ± 0.004 | 17.67 ± 0.54 | 60.46 ± 2.42 | 7.72 ± 0.25 (8.33) |
| Comparative Example 2 | 0.73 ± 0.005 | 15.25 ± 0.13 | 68.71 ± 0.52 | 7.63 ± 0.1 (7.87) |
| Comparative Example 3 | 0.73 ± 0.005 | 14.48 ± 0.92 | 55.96 ± 3.40 | 5.94 ± 0.56 (6.25) |

It is thought that the short-circuit current density of the organic solar cell according to Example 3 is improved because light trapping in the photoactive layer is improved owing to the high light transmittance of the thin film laminate of a triple-layer structure at 550-750 nm, which corresponds to the light absorption wavelength of the photoactive layer.

Example 10: Lifetime Characteristics of Organic Solar Cell

The lifetime of the organic solar cells according to Example 3, Comparative Example 1, Comparative Example 3, Comparative Example 4 and Comparative Example 5 was measured under the condition of 40° C. and 85% relative humidity. The lifetime of the organic solar cells was measured by measuring the decrease in the efficiency of the organic solar cells with time.

As described above, the organic solar cell of Comparative Example 3 is an organic solar cell wherein glass substrate/ITO is used as a lower substrate and the encapsulation film of Example 1 is used, the organic solar cell of Comparative Example 4 is the organic solar cell of Example 3 wherein glass is used as an encapsulation film instead of the encapsulation film of Example 1, and the organic solar cell of Comparative Example 5 is the organic solar cell of Comparative Example 3 wherein the encapsulation film of Example 1 is not used.

FIG. 12A shows the effect of the flexible substrate/thin film laminate of a triple-layer structure of Example 1 on the lifetime of the organic solar cell when applied to an encapsulation film and compares Comparative Example 3 wherein the flexible substrate/thin film laminate of a triple-layer structure of Example 1 is used as an encapsulation film and Comparative Example 4 wherein glass is used as an encapsulation film. As shown in FIG. 12A, both Comparative Example 3 and Comparative Example 4 maintained photoconversion efficiency at about 80% or higher for 900 hours. This result confirms that the use of the flexible substrate/thin film laminate of a triple-layer structure of Example 1 as an encapsulation film can stably maintain the lifetime of the organic solar cell.

FIG. 12B shows the lifetime characteristics of the organic solar cells depending on the presence or absence of an encapsulation film. As shown in FIG. 12B, whereas the photoconversion efficiency of the organic solar cell according to Example 3 reached 80% of the initial value in 135 hours, it reached 50% of the initial photoconversion efficiency in 384 hours for Comparative Example 1, suggesting that the organic solar cell according to Example 3 has improved lifetime over that of Comparative Example 1.

[Detailed Description of Main Elements]

10: flexible substrate
20: thin film laminate of a triple-layer structure
21: SiN$_x$ thin film
22: SiO$_x$ thin film
23: SiO$_x$N$_y$ thin film
30: transparent electrode
40: active layer
50: upper electrode

The invention claimed is:

1. A flexible transparent electrode structure comprising:
a flexible substrate;
a thin film laminate of a triple-layer structure formed on both sides of the flexible substrate; and
a transparent electrode formed on the thin film laminate of a triple-layer structure provided on one side of the flexible substrate,
wherein the thin film laminate of a triple-layer structure comprises a SiN$_x$ thin film, a SiO$_x$N$_y$ thin film and a SiO$_x$ thin film formed sequentially on the flexible substrate.

2. The flexible transparent electrode structure according to claim 1, wherein the flexible transparent electrode structure has an average light transmittance of 86.56% or higher in a wavelength range of 550-720 nm.

3. The flexible transparent electrode structure according to claim 1, wherein the structure with the thin film laminate of a triple-layer structure formed on both sides of the flexible substrate has a water vapor transmission rate of 5×10$^{-5}$ g/m$^2$/day or lower.

4. The flexible transparent electrode structure according to claim 1, wherein the structure with the thin film laminate of a triple-layer structure formed on both sides of the flexible substrate has an oxygen transmission rate of 5×10$^{-3}$ cc/m$^2$/day/atm or lower.

5. The flexible transparent electrode structure according to claim 1, wherein
the SiN$_x$ thin film, the SiO$_x$N$_y$ thin film and the SiO$_x$ thin film forms a refractive index gradient, and
the SiN$_x$ thin film has the highest refractive index and the SiO$_x$ thin film has the lowest refractive index.

6. The flexible transparent electrode structure according to claim 1, wherein the transparent electrode is composed of a metal nanowire and a polymer conductor.

7. An organic optoelectronic device comprising the flexible transparent electrode structure according to claim 1 as a lower substrate.

8. The organic optoelectronic device according to claim 7, wherein the flexible transparent electrode structure has an average light transmittance of 86.56% or higher in a wavelength range of 550-720 nm.

9. The organic optoelectronic device according to claim 7, wherein the structure with the thin film laminate of a triple-layer structure formed on both sides of the flexible substrate has a water vapor transmission rate of $5\times10^{-5}$ g/m²/day or lower.

10. The organic optoelectronic device according to claim 7, wherein the structure with the thin film laminate of a triple-layer structure formed on both sides of the flexible substrate has an oxygen transmission rate of $5\times10^{-3}$ cc/m²/day/atm or lower.

11. The organic optoelectronic device according to claim 7, wherein
the $SiN_x$ thin film, the $SiO_xN_y$ thin film and the $SiO_x$ thin film forms a refractive index gradient, and
the $SiN_x$ thin film has the highest refractive index and the $SiO_x$ thin film has the lowest refractive index.

12. The organic optoelectronic device according to claim 7, wherein the transparent electrode is composed of a metal nanowire and a polymer conductor.

13. The organic optoelectronic device according to claim 7, wherein the organic optoelectronic device is any of an organic solar cell, an organic light-emitting diode, a perovskite solar cell and a photoelectrochemical cell.

14. The organic optoelectronic device according to claim 7, wherein the organic optoelectronic device further comprises an encapsulation film encapsulating the organic optoelectronic device, the encapsulation film has a structure in which a thin film laminate of a triple-layer structure is formed on both sides of a flexible substrate, and the thin film laminate of a triple-layer structure has a $SiN_x$ thin film, a $SiO_xN_y$ thin film and a $SiO_x$ thin film formed sequentially on the flexible substrate.

* * * * *